(12) United States Patent
Melanson

(10) Patent No.: US 6,346,898 B1
(45) Date of Patent: Feb. 12, 2002

(54) MULTILEVEL ANALOG TO DIGITAL DATA CONVERTER HAVING DYNAMIC ELEMENT MATCHING IN A REFERENCE DATA PATH

(75) Inventor: John Laurence Melanson, Austin, TX (US)

(73) Assignee: Audio Logic, Inc., Boulder, CO (US)

( * ) Notice: Subject to any disclaimer, the term of this patent is extended or adjusted under 35 U.S.C. 154(b) by 0 days.

(21) Appl. No.: 09/633,381

(22) Filed: Aug. 7, 2000

(51) Int. Cl.⁷ .............................................. H03M 1/60
(52) U.S. Cl. ........................................ 341/143; 341/155
(58) Field of Search ................................. 341/143, 144, 341/154, 155, 118, 120

(56) References Cited

U.S. PATENT DOCUMENTS

| | | | |
|---|---|---|---|
| 5,030,954 A | * | 7/1991 | Ribner ........................ 341/143 |
| 5,305,004 A | * | 4/1994 | Fattaruso ..................... 341/120 |
| 6,211,805 B1 | * | 4/2001 | Yu .............................. 341/155 |

* cited by examiner

*Primary Examiner*—Howard L. Williams
(74) *Attorney, Agent, or Firm*—Jennifer L. Bales; Macheledt Bales LLP

(57) ABSTRACT

In a delta sigma analog to digital converter, generally comprising a noise shaping filter element fed into a multilevel quantizer, the output of which is the output of the delta sigma modulator and is also fed through a digital to analog converter array in a feedback loop to the noise shaping filter, dynamic element matching circuitry is included in the quantizer, in a reference path. The quantizer includes dynamic element matching circuitry for shaping the usage of the elements of the quantizer. Specifically, reference voltages are switched to specific comparators according to control signals from switch control circuitry.

11 Claims, 5 Drawing Sheets

MULTILEVEL ANALOG TO DIGITAL DATA CONVERTER HAVING DYNAMIC ELEMENT MATCHING IN A REFERENCE DATA PATH

BACKGROUND OF THE INVENTION

1. Field of the Invention

The present invention relates to multilevel analog to digital data converters (ADCs). More particularly, the present invention relates to multilevel ADCs having dynamic element matching in a reference data path.

2. Description of the Prior Art

Multiple level, or multilevel, analog to digital data converters (ADCs), are useful in high speed, high power applications, for example for converting an input analog signal into a digital signal prior to digital signal processing. One type of ADC for high speed applications is based upon a delta sigma modulator. Delta sigma modulation incorporates a noise-shaping technique whereby the noise of a quantizer operating at a frequency much greater than the bandwidth is moved to frequencies not of interest in the output signal. A filter after the quantizer removes the out of band noise. The resulting system synthesizes a high resolution data converter, but is constructed from low resolution building blocks. A good overview of the theory of delta sigma modulation is given in "Delta-Sigma Data Converters," by Norsworthy, Schreier and Temes, IEEE Press, 1997. Another useful reference is "A 2.5MSample/s Multi-bit DS CMOS ADC with 95 dB SNR" by Geerts et al, ISSCC 2000/Paper WA 20.2, Feb. 9, 2000.

FIG. 1 shows a conventional multilevel delta sigma ADC 100. A delta sigma ADC generally comprises a noise shaping filter element 101 which feeds into a quantizer 102, the output of which, signal 106, is the input to digital filter 109 and is also fed through a digital to analog converter 104 in a feedback loop to the noise shaping filter. The output of DAC 104 is combined with input signal 102 by analog summer 105. In a delta sigma converter, there are three major factors which contribute to dynamic range, the order of the loop (generally the number of cascaded integrators), the number of levels of the quantizer, and the over sample ratio. In the case of an A/D converter, the noise shaping filter integrators are time sampled analog, usually switched capacitor, and the output is a digital bit stream to a digital decimation filter 109, which separates out the desired band of interest 110 and passes it along for digital signal processing. Filter 101 is normally a low pass filter, although a bandpass filter is used for some applications. Quantizer 102 is often referred to as a flash A/D converter, and is typically designed from an array of comparators.

In practice, delta sigma modulators are generally at least second order, because higher order modulators better reduce noise in the signal band, due to improved filtering functions. Thus, the resulting signal to noise ratio is better. Second order delta sigma modulators are relatively stable, and easy to design. U.S. Pat. No. 5,392,042 describes how to build high order modulators for higher precision. U.S. Pat. No. 5,461,381 provides a good reference on implementation details of switched capacitor sigma delta converters.

One technique for better matching the DAC levels in the feedback to the quantizer levels in the main signal path is shown in FIG. 2 (Prior Art). A dynamic element matching (DEM) block 202 and a switch block 204 are placed between the comparators of quantizer 102 and DAC array 104. An example of DEM block 202 circuitry is shown in FIG. 3 (Prior Art). DEM block 202 and switch block 204 shape the usage of the elements in DAC array 104. For example, the DEM can be designed to ensure that all elements are used the same proportion of the time. Note, however, that the use of DEM circuitry 202 and switch circuitry 204 in the feedback path adds delay in the feedback, the most delay sensitive part of the ADC. This is important when high speed operation is desired. In addition, the quantizer is sensitive to errors due to the offset error of the comparators. This becomes more of a problem at low oversample ratios, typical of high speed operation.

FIG. 3 (Prior Art) shows one possible configuration of DEM 202. For more detail, refer to "Delta-Sigma Data Converters," by Norsworthy, Schreier and Temes, IEEE Press, 1997, pp. 260–264. Quantized signal 106 from multilevel quantizer 102 feeds vector quantizer 302, which provides selection vector 312 (in this case signal 208), a collection of bits used to selectively enable switches 204 Switches 204 route the selection signals to the proper DAC elements. Signal 312 also feeds into an error feedback structure comprising adders 304 and 310, filter 306 (for normalizing the transfer function of DEM logic 202, as vector quantizer has a transfer function of $H_2$).Block 308 keeps all of the signal values in range, as is required for finite precision arithmetic. The operation of the DEM can be summed up as: Given a number 302 m between 0 and n, where n is the number of total elements, find the most "needy" m of the n elements, and use them at this time. Update the amount of "need" based on that usage in time for the next sample. For a first order DEM, "need" is based on the total usage of each element, the most needy is the element than has been used the least. For a second order DEM, the timing of the use is also taken into account.

The disadvantage of DEM/switch circuitry 202 and 204 is that it is in a signal path (in this case the feedback path) and therefore adds delay to the signal. This is undesirable in high speed operation.

A need remains in the art for a low power multilevel ADC with sufficient signal to noise ratio and dynamic range at high speed operation.

SUMMARY OF THE INVENTION

An object of the present invention is to provide a low power multilevel ADC with sufficient signal to noise ratio and dynamic range at high speed operation. This object is accomplished by moving dynamic element matching function from a signal path of the delta sigma modulator to a reference signal path.

A delta sigma analog to digital converter (ADC) has a noise shaping filter element feeding a multilevel quantizer which provides an output signal and a feedback signal to a digital to analog converter (DAC) feeding back to the direct signal path. The multilevel quantizer includes dynamic element matching (DEM) circuitry to shape the usage of the quantizer comparators.

The DEM circuitry is moved to a reference path (not part of the signal path) in order to remove the time delay effect. Preferably, the DEM circuitry switches the reference voltages applied to the comparators in the multilevel quantizer. This results in comparator offset error being shaped.

DETAILED DESCRIPTION OF THE PREFERRED EMBODIMENT

Figure 1:
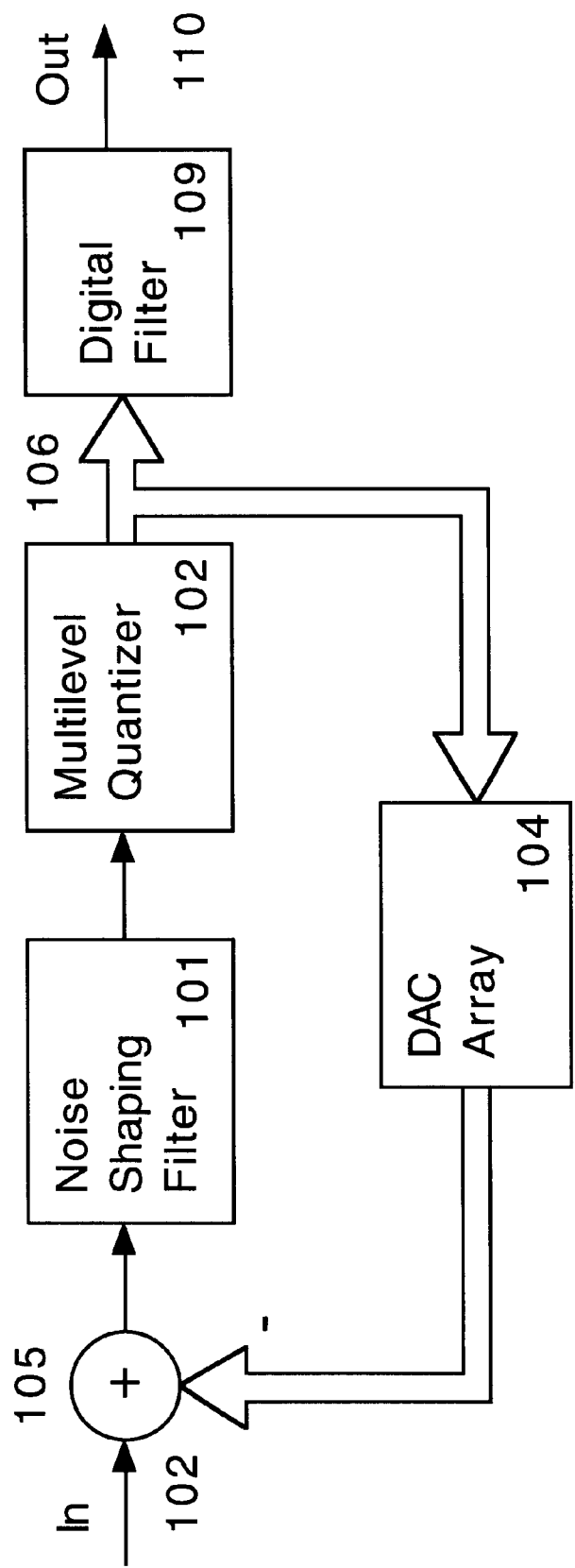
FIG. 1 (prior art) is a block diagram which shows a conventional delta sigma analog to digital converter having a multilevel quantizer.
Figure 2:
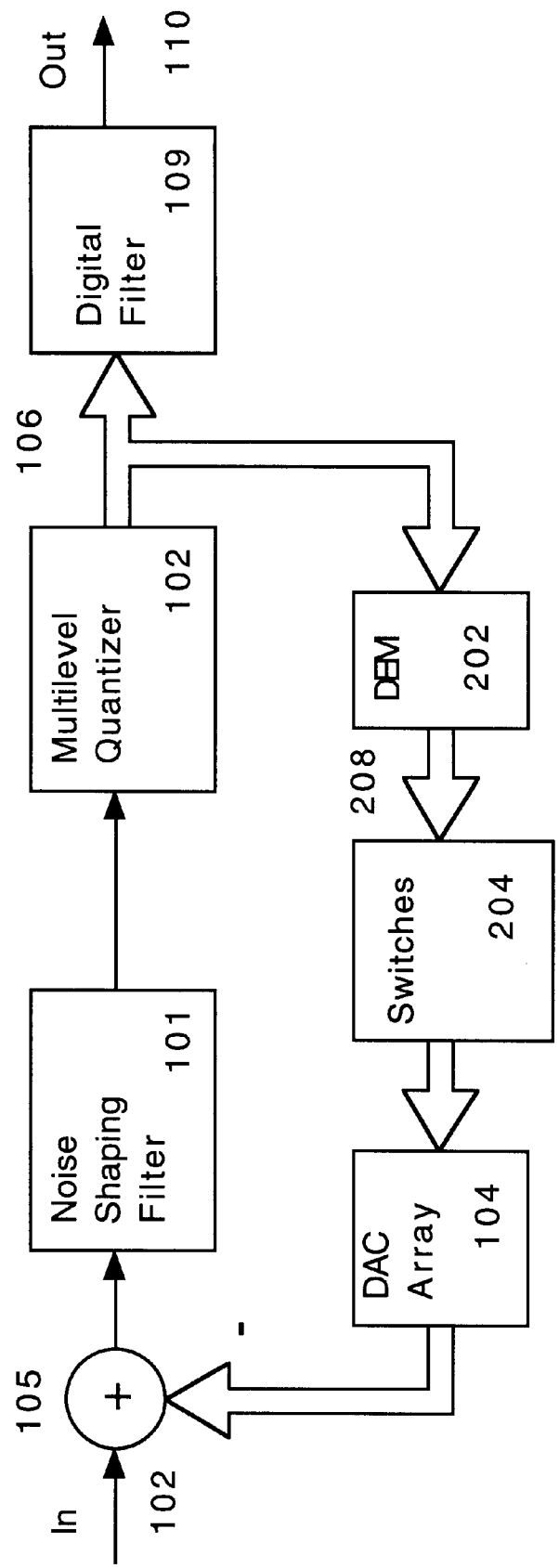
FIG. 2 (prior art) is a block diagram which shows the delta sigma analog to digital converter of FIG. 1, with dynamic element matching circuitry inserted prior to the feedback DAC array.
Figure 4:
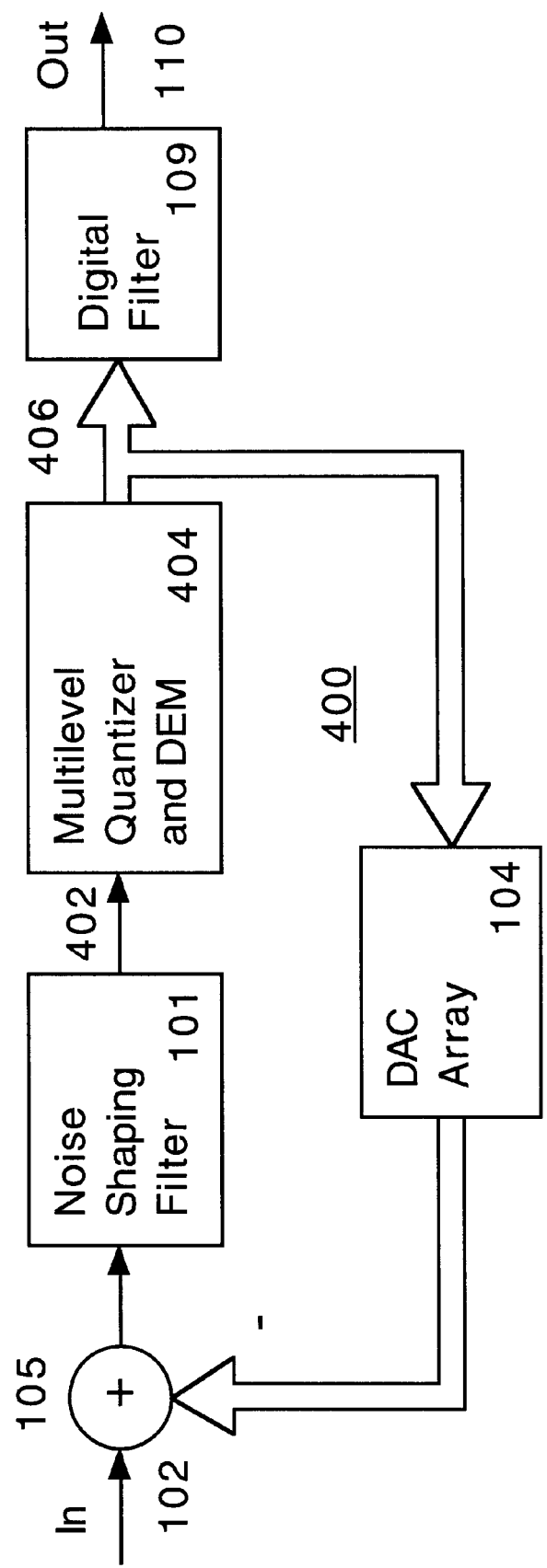
FIG. 4 is a block diagram which shows a delta sigma analog to digital converter similar to that of FIG. 1, having DEM circuitry built into the quantizer element, in a reference path.
Figure 5:
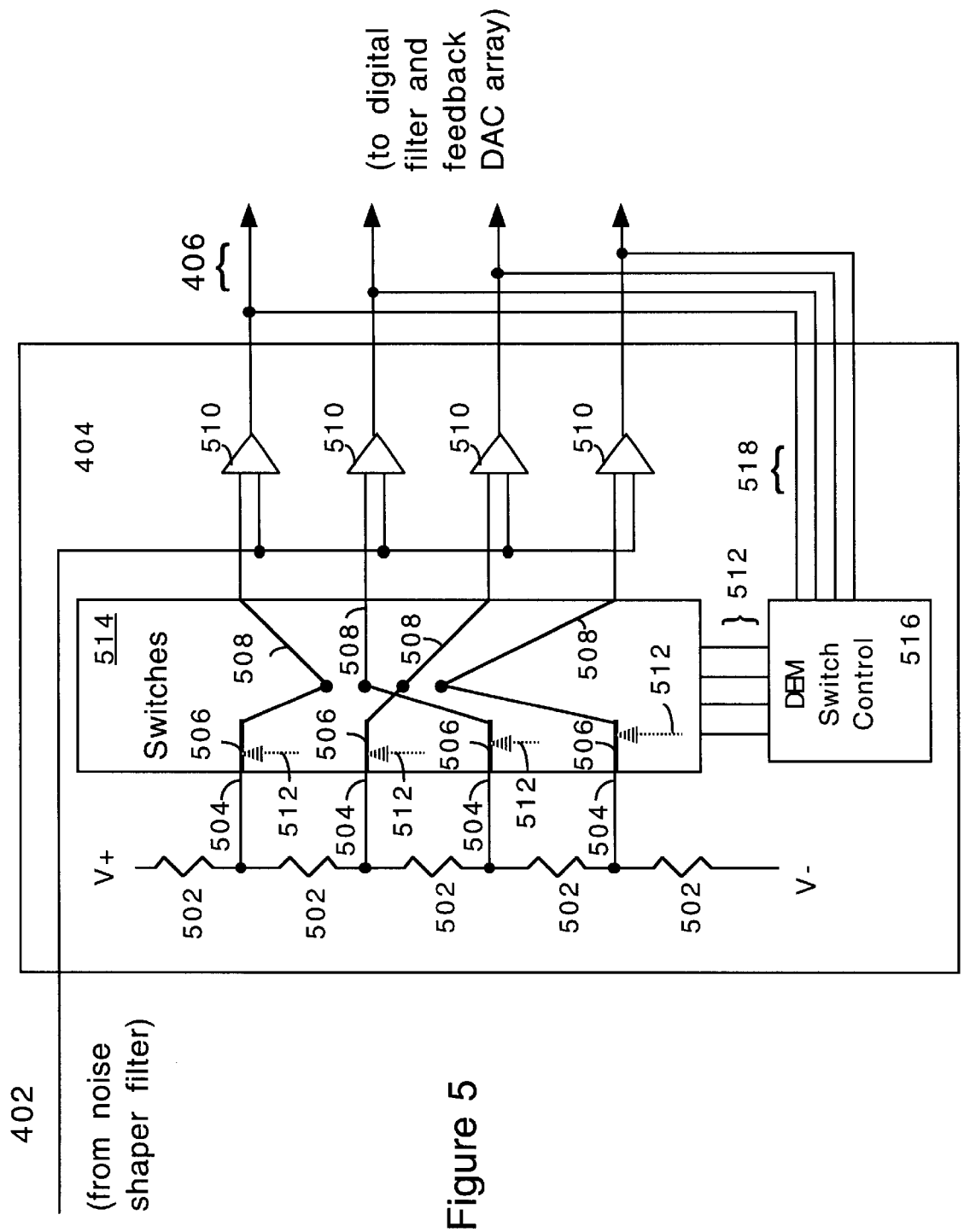
FIG. 5 is a block diagram which shows the combined quantizer and DEM circuitry of FIG. 4 in more detail.

FIG. 4 is a block diagram showing a delta sigma analog to digital converter 400, which is similar to ADC 100 of FIG. 1, except it further includes DEM circuitry built into the quantizer element 404, in a reference path. Input signal 102 is added to the feedback signal from DAC array 104 and provided to noise shaping filter 101 (generally a cascade of integrators). The noise shaped output 402 of filter 101 is applied to multilevel quantizer 404, which utilizes comparators 510 to select the nearest output value 406 to the input value 402. This type of ADC is known as a flash converter. U.S. Pat. No. 5,402,128 describes a possible structure for a multibit flash ADC. FIG. 5 shows an example of quantizer/DEM block 404 in more detail.

Multibit output 406 is the output of the delta sigma modulator, and is fed to digital filter 109, which provides digital output signal 110 for further digital signal processing. All elements of 406 typically carry the same weight, as the DAC elements are nominally equal. Signal 406 is also the feedback signal fed to DAC array 104, which converts the multibit digital signal into an analog signal. Quantizer 404 includes dynamic element matching (DEM) circuitry for shaping the usage of the comparators of the quantizer.

Digital output signal 406 is filtered by low pass filter 109 to remove the out of band noise resulting from quantizer 404. In general filter 109 includes a decimator which outputs signal 110 at an appropriate sample rate for the system. The ratio between the sample rate of the noise shaping filter 101 and the output sample rate of signal 110 is called the oversample ratio, or OSR. The OSR will typically be from 8 to 1024.

FIG. 5 is a block diagram which shows one possible configuration of the combined quantizer and DEM circuitry 404 in more detail. Analog signal 402 from noise shaping filter 101 is fed to a series of comparators 510 (four in this example, providing five output levels). The other signal into the comparators is provided from series of resistors 502, which divide voltage V+/N− into a series of reference voltages 504. These reference voltages are typically evenly spaced, although there are some advantages to unequal spacing for low signal levels.

Figure 3:
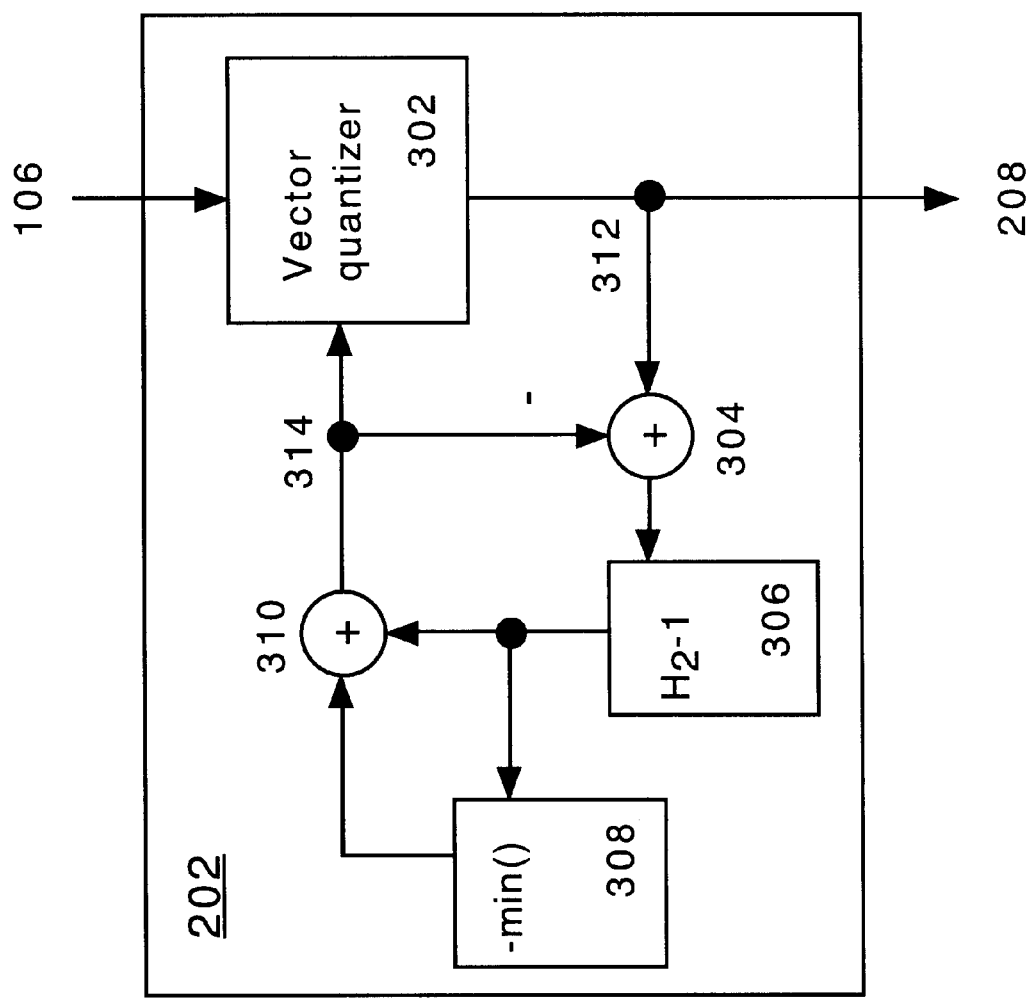
FIG. 3 (prior art) is a block diagram which shows an example of the DEM of FIG. 2.

Dynamic element matching capability is provided by switch block 514, controlled by DEM switch control block 516. Only one possible switch configuration is shown for clarity, but each input 504 can be switched to each output 508 via a switch 506, per control signals 516. Note that each reference voltage 504 is supplied to one, and only one, comparator 510. Switches 506 are controlled by control signals 512 from DEM switch control block 516, based upon feedback signals 518. FIG. 3 illustrates how DEM block 516 might operate. Comparators 510 provide multibit signal 406, which is the output signal from the delta sigma modulator, and also the feedback signal to ADC block 104.

This arrangement provides the same function as the prior art, in that the usage of all elements is shaped, but with significant advantages. The DEM logic is out of the time critical path, which is the 402 to 406 signal path. This allows for faster operation. In addition, there are typically offsets in comparators 510. This is due to component imperfections. This offset decreases the performance in the prior art. In the present invention, that offset is noise shaped, and the degradation is minimized.

With the DEM control out of the critical path, it becomes possible to use a more sophisticated and higher order DEM noise shaping strategy. It is preferred to have the DEM be of second order, where the H2 function is described by $(1-z^{-1})^2$. This reduces the noise due to element mismatch, and is especially valuable where the oversample ration is low.

While the exemplary preferred embodiments of the present invention are described herein with particularity, those skilled in the art will appreciate various changes, additions, and applications other than those specifically mentioned, which are within the spirit of this invention.

What is claimed is:

1. A multilevel analog to digital converter (ADC) having a noise shaping filter feeding a multilevel quantizer having comparators fed by reference levels and a signal from the noise shaping filter, the quantizer providing an ADC output signal and providing a feedback signal to a digital to analog converter (DAC), the output of the DAC being combined with the ADC input and provided to the noise shaping filter, the improvement comprising:

the multilevel quantizer includes dynamic element matching circuitry (DEM) including switches for selectively switching the reference levels provided to the comparators in the quantizer during operation of the ADC; and DEM switch control circuitry to control the DEM switches.

2. The ADC of claim 1, wherein the DEM switch control circuitry is responsive to previous outputs of the comparators.

3. The ADC of claim 2, where the DEM switch control circuitry operates in such a way as to noise shape the usage of the comparators.

4. The ADC of claim 3, wherein the DEM switch control circuitry has a second order noise transfer function.

5. The ADC of claim 4, wherein the DEM switch control circuitry has a noise transfer function described by $(1-z^{-1})^2$.

6. A multilevel analog to digital converter (ADC) comprising:

a noise shaping filter having an ADC input;

a multilevel quantizer having comparators fed by reference levels and a signal from the noise shaping filter;

wherein the quantizer provides an ADC output signal and a feedback signal; and a digital to analog converter array for converting the feedback signal and providing it as an input to the quantizer;

wherein the multilevel quantizer includes dynamic element matching circuitry (DEM) including switches for selectively switching the reference levels provided to the comparators in the quantizer during operation of the ADC; and DEM switch control circuitry to control the DEM switches.

7. The ADC of claim 6, wherein the DEM switch control circuitry is responsive to previous outputs of the comparators.

8. The ADC of claim 7, where the DEM switch control circuitry operates in such a way as to noise shape the usage of the comparators.

9. The ADC of claim 8, wherein the DEM switch control circuitry has a second order noise transfer function.

10. A method for noise shaping elements in a quantizer having comparators fed by reference signals and fed by a noise shaper, the quantizer providing an output and a feedback signal to the noise shaper, the method comprising the steps of:

receiving previous outputs of the comparators, and switching the reference signals provided to the comparators according to the received outputs.

11. The method of claim 10, wherein the step of switching operates according to a second order noise transfer function.

* * * * *